(12) United States Patent
Urabe et al.

(10) Patent No.: US 7,795,897 B1
(45) Date of Patent: Sep. 14, 2010

(54) TEST APPARATUS AND DRIVER CIRCUIT

(75) Inventors: Yasuhiro Urabe, Gunma (JP); Naoki Matsumoto, Saitama (JP); Yuji Kuwana, Gunma (JP)

(73) Assignee: Advantest Corporation, Tokyo (JP)

( * ) Notice: Subject to any disclaimer, the term of this patent is extended or adjusted under 35 U.S.C. 154(b) by 32 days.

(21) Appl. No.: 12/412,364

(22) Filed: Mar. 27, 2009

(51) Int. Cl.
*G01R 31/26* (2006.01)

(52) U.S. Cl. .................................... 324/765

(58) Field of Classification Search ............... 324/765, 324/158.1, 763, 768–769; 257/48; 438/14–18
See application file for complete search history.

(56) References Cited

U.S. PATENT DOCUMENTS

| | | | |
|---|---|---|---|
| 6,801,033 B2 * | 10/2004 | Sudo et al. | 324/158.1 |
| 6,844,751 B2 * | 1/2005 | Marshall et al. | 324/765 |
| 7,348,791 B1 | 3/2008 | Mayder | |

* cited by examiner

*Primary Examiner*—Ha Tran T Nguyen
*Assistant Examiner*—Tung X Nguyen
(74) *Attorney, Agent, or Firm*—Jianq Chyun IP Office

(57) ABSTRACT

Provided is a test apparatus that tests a device under test, comprising a driver circuit that generates an output signal according to a prescribed input pattern, and supplies the output signal to the device under test; and a measuring section that measures a response signal output by the device under test to judge the acceptability of the device under test, wherein the driver circuit includes an input gate drive section that selects one of a plurality of input drive voltages supplied thereto, according to a logic value of the input pattern, and outputs the selected input drive voltage; a voltage switching section that includes a transistor and that outputs the output signal according to the drain voltage of the transistor, the transistor having a gate terminal that receives the input drive voltage output by the input gate drive section and a source terminal to which is applied a prescribed reference voltage; and an input drive voltage supplying section that generates the input drive voltages according to the reference voltage, and supplies the input drive voltages to the input gate drive section.

9 Claims, 5 Drawing Sheets

TEST APPARATUS AND DRIVER CIRCUIT

BACKGROUND

1. Technical Field

The present invention relates to a test apparatus and a driver circuit.

2. Related Art

A semiconductor test apparatus outputs, to a semiconductor device, an output signal for testing that is generated based on a prescribed input pattern. The semiconductor test apparatus switches the voltage of the output signal according to the input pattern by using a CMOS analog switch to switch the reference voltage. Such an apparatus is described in U.S. Pat. No. 7,348,791.

The operational voltage of the CMOS analog switch, however, is dependent on the resistance value when the switch is connected (hereinafter referred to as being "ON"). Accordingly, the output impedance of the semiconductor test apparatus changes depending on a change in the voltage of the output signal based on the input pattern. As a result, it is difficult for the semiconductor test apparatus to match the output impedance to the characteristic impedance of the transmission line.

Furthermore, if the voltage of the output signal has a large amplitude, the CMOS analog switch must have a high withstand voltage according to the voltage of the output signal. A high-withstand-voltage CMOS analog switch has a high RC product, which is a product of the ON resistance R and the capacitance C. In this case, the high ON resistance of the CMOS analog switch is a problem, as is the fact that high capacitance prevents high-speed switching.

SUMMARY

Therefore, it is an object of an aspect of the innovations herein to provide a test apparatus and a driver circuit, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a driver circuit that generates an output signal according to a prescribed input pattern, and supplies the output signal to the device under test; and a measuring section that measures a response signal output by the device under test to judge the acceptability of the device under test. The driver circuit includes an input gate drive section that selects one of a plurality of input drive voltages supplied thereto, according to a logic value of the input pattern, and outputs the selected input drive voltage; a voltage switching section that includes a transistor and that outputs the output signal according to the drain voltage of the transistor, the transistor having a gate terminal that receives the input drive voltage output by the input gate drive section and a source terminal to which is applied a prescribed reference voltage; and an input drive voltage supplying section that generates the input drive voltages according to the reference voltage, and supplies the input drive voltages to the input gate drive section.

According to a second aspect related to the innovations herein, one exemplary test apparatus may include a test apparatus that tests a device under test, comprising a driver circuit that generates an output signal according to a prescribed input pattern, and supplies the output signal to the device under test; and a measuring section that measures a response signal output by the device under test to judge the acceptability of the device under test. The driver circuit includes an input gate drive section that selects one of a plurality of input drive voltages supplied thereto, according to a logic value of the input pattern, and outputs the selected input drive voltage; a voltage switching section that includes a transistor and that outputs the output signal according to the source voltage of the transistor, the transistor having a gate terminal that receives the input drive voltage output by the input gate drive section and a drain terminal to which is applied a prescribed reference voltage; and an input drive voltage supplying section that generates the input drive voltages according to the reference voltage, and supplies the input drive voltages to the input gate drive section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
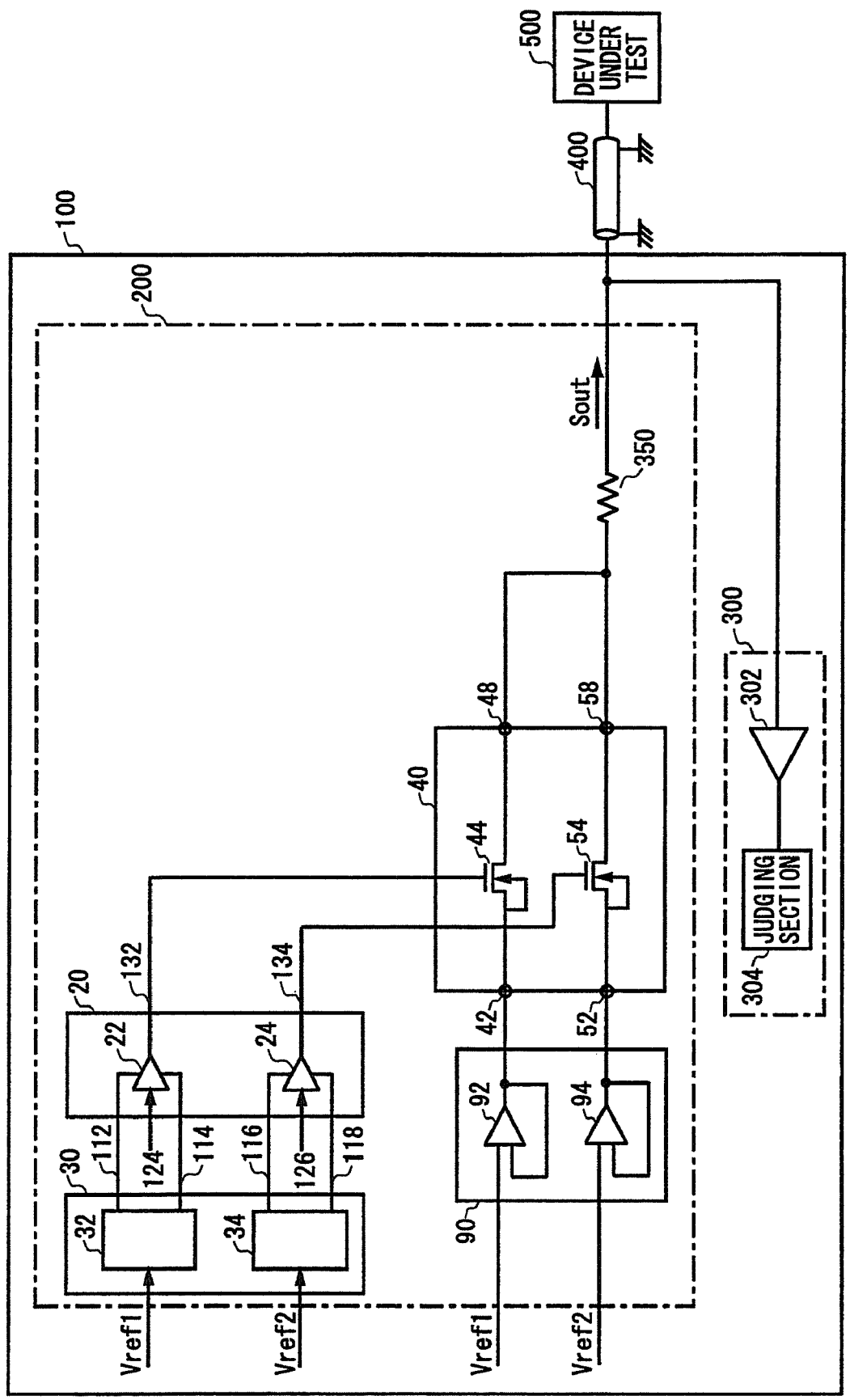
FIG. 1 shows a configuration of the test apparatus 100 according to an embodiment of the present invention.

FIG. 1 shows a configuration of the test apparatus 100 according to an embodiment of the present invention. The test apparatus 100 tests a device under test 500 including a semiconductor circuit or the like. The test apparatus 100 may be connected to the device under test 500 by a transmission line 400.

The test apparatus 100 is provided with a driver circuit 200 and a measuring section 300. The driver circuit 200 generates an output signal Sout according to a prescribed input pattern, and supplies the output signal Sout to the device under test 500. The measuring section 300 measures a response signal output by the device under test 500 to judge the acceptability of the device under test 500. The output signal Sout may be a signal having a prescribed logic pattern, a clock signal, or the like.

The driver circuit 200 includes an input gate drive section 20, an input drive voltage supplying section 30, and a voltage switching section 40. The input gate drive section 20 selects one of a plurality of input drive voltages supplied thereto, according to a logic value of the input pattern, and outputs the selected voltage. The input drive voltage supplying section 30 generates the input drive voltage according to a prescribed reference voltage, and supplies this voltage to the input gate drive section 20.

The voltage switching section 40 includes a plurality of transistors that each receive, at a gate terminal, the input drive voltage output by the input gate drive section 20 and that have the prescribed reference voltage applied to the source terminal thereof. The voltage switching section 40 outputs an output signal according to a drain voltage of a transistor. In the voltage switching section 40, the plurality of transistors are in a cascade connection between voltage input terminals to which the reference voltage is applied and output terminals from which output signals are output. The voltage input terminals may be source terminals of the transistors. The output terminals may be drain terminals of the transistors.

The driver circuit 200 further includes a voltage follower circuit 90. The voltage follower circuit 90 supplies the reference voltage to the voltage switching section 40. The voltage follower circuit 90 includes a first voltage follower 92 and a second voltage follower 94, which correspond respectively to a first reference voltage Vref1 and a second reference voltage Vref2. The driver circuit 200 may output the output signal Sout having a voltage corresponding to either the first reference voltage Vref1 or the second reference voltage Vref2.

The driver circuit 200 may be provided with an output resistor 350 between the voltage switching section 40 and the transmission line 400. The output resistor 350 may have a resistance value obtained by subtracting (i) the total value of the ON resistance values of the cascade-connected transistors in the voltage switching section 40 from (ii) the characteristic impedance value of the transmission line 400.

The measuring section 300 includes a voltage comparator 302 and a judging section 304. The voltage comparator 302 measures the voltage of the transmission line 400 electrically connecting the output terminal of the driver circuit 200 to an input/output pin of the device under test 500. The voltage comparator 302 may measure the voltage of the transmission line 400 between the output resistor 350 and the transmission line 400. The judging section 304 judges the acceptability of the device under test 500 based on the voltage of the transmission line 400 measured by the voltage comparator 302.

The following is a detailed description of the operation of the driver circuit 200. In the present embodiment, the voltage switching section 40 includes a transistor 44 between a voltage input terminal 42 to which the first reference voltage Vref1 is supplied and an output terminal 48 from which an output signal is output. The voltage switching section 40 further includes a transistor 54 between a voltage input terminal 52 to which the second reference voltage Vref2 is supplied and an output terminal 58 from which an output signal is output.

Each transistor may be either an NMOS transistor or a PMOS transistor, or may be a mixture of an NMOS transistor and a PMOS transistor. An NMOS transistor has a smaller capacitance and surface area than a PMOS transistor with the same capability. Therefore, the voltage switching section 40 can achieve high-speed switching by using NMOS transistors for the transistor 44 and the transistor 54.

The input gate drive section 20 includes a first input gate drive section 22 and a second input gate drive section 24. The input drive voltage supplying section 30 includes a first input drive voltage supplying section 32 and a second input drive voltage supplying section 34. The first reference voltage Vref1 is applied to an input terminal of the first input drive voltage supplying section 32. The second reference voltage Vref2 is applied to an input terminal of the second input drive voltage supplying section 34.

The first input drive voltage supplying section 32 can apply a first high input drive voltage 112, which is higher than the first reference voltage Vref1 by a first prescribed voltage, to the first input gate drive section 22. The first input drive voltage supplying section 32 can also apply a first low input drive voltage 114, which is lower than the first reference voltage Vref1 by a second prescribed voltage, to the first input gate drive section 22. The first prescribed voltage and the second prescribed voltage may be the same.

In the same way, the second input drive voltage supplying section 34 can apply a second high input drive voltage 116, which is higher than the second reference voltage Vref2 by the first prescribed voltage, to the second input gate drive section 24. The second input drive voltage supplying section 34 can also apply a second low input drive voltage 118, which is lower than the second reference voltage Vref2 by the second prescribed voltage, to the second input gate drive section 24.

The first prescribed voltage may be greater than or equal to a threshold voltage between the gate terminal and the source terminal at which conduction is achieved between the drain terminal and the source terminal in each of the transistors 44 and 54. The second prescribed voltage may be a voltage greater than or equal to 0. The first prescribed voltage and the second prescribed voltage may be variable voltages.

The input drive voltage supplying section 30 generates the input drive voltage based on the first reference voltage Vref1 and the second reference voltage Vref2. Accordingly, even if the reference voltage value is changed for a different test, the input drive voltage supplying section 30 can follow the reference voltage and change the input drive voltage accordingly. Therefore, regardless of the reference voltage, the driver circuit 200 can maintain a constant voltage between the source terminal and the gate terminal in each of the transistors 44 and 54. As a result, the withstand voltage between the source terminal and the gate terminal in each of the transistors 44 and 54 may be a voltage obtained by adding a prescribed margin to the first prescribed voltage and the second prescribed voltage.

A first input pattern 124 is input to the first input gate drive section 22. A second input pattern 126 is input to the second input gate drive section 24. The second input pattern 126 may be obtained by inverting the first input pattern 124. The first input pattern 124 and the second input pattern 126 may be different patterns depending on the content of the tests for the device under test 500.

The first input gate drive section 22 selects either the first high input drive voltage 112 or the first low input drive voltage 114 according to the logic value of the first input pattern 124, and outputs the selected voltage to the first input drive voltage 132. The first input gate drive section 22 applies the first input drive voltage 132 to the gate terminal of the transistor 44. In the same way, the second input gate drive section 24 selects either the second high input drive voltage 116 or the second low input drive voltage 118 according to the logic value of the second input pattern 126, and outputs the selected voltage to the second input drive voltage 134. The second input gate drive section 24 applies the second input drive voltage 134 to the gate terminal of the transistor 54.

For example, when the logic value of the first input pattern 124 is 1, the first input gate drive section 22 selects the first high input drive voltage 112 and applies this voltage to the gate terminal of the transistor 44. When the logic value of the first input pattern 124 is 0, the first input gate drive section 22 selects the first low input drive voltage 114 and applies this voltage to the gate terminal of the transistor 44. In the same way, when the logic value of the second input pattern 126 is 1, the first input gate drive section 22 selects the second high input drive voltage 116 and applies this voltage to the gate terminal of the transistor 54. When the logic value of the second input pattern 126 is 0, the first input gate drive section 22 selects the second low input drive voltage 118 and applies this voltage to the gate terminal of the transistor 54.

As described above, in the test apparatus 100 of the present embodiment, the voltage between the source terminals and the gate terminals of the transistors 44 and 54 is maintained to be approximately the same as the first prescribed voltage or the second prescribed voltage, regardless of the voltage applied to the voltage input terminal 42 and the voltage input terminal 52. As a result, the test apparatus 100 can use transistors with low withstand voltages between the source terminals and the gate terminals, regardless of the voltage involved in testing the device under test 500.

A transistor with a low withstand voltage has a low RC product. Accordingly, such a transistor has a lower capacitance C than a transistor with a high RC product and the same ON resistance R. As a result, using a low withstand voltage transistor allows high-speed switching. In other words, the test apparatus 100 of the present embodiment can test the device under test 500 at a high speed using a high-voltage signal.

Figure 2:
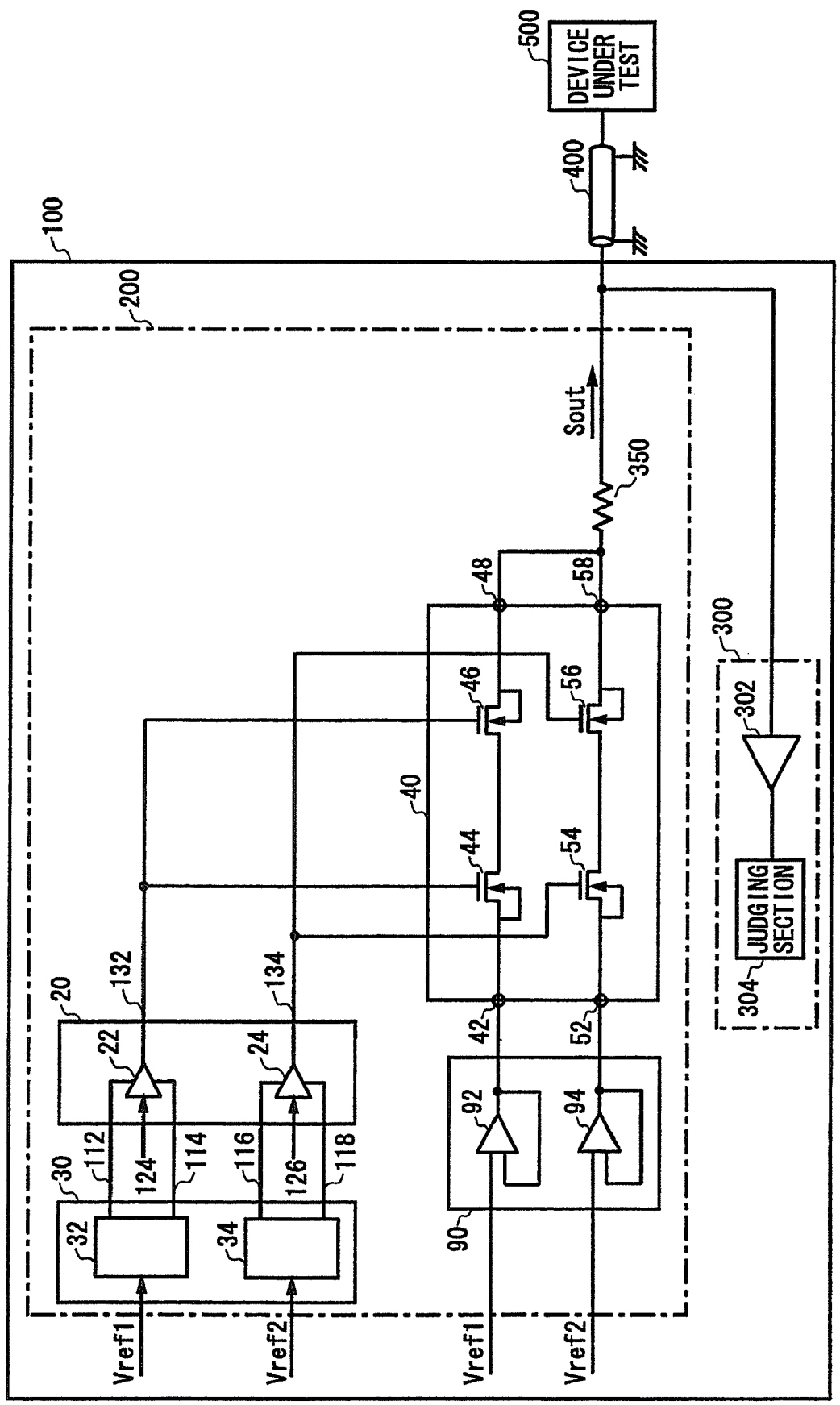
FIG. 2 shows an exemplary configuration of the test apparatus 100 according to another embodiment of the present invention.

FIG. 2 shows an exemplary configuration of the test apparatus 100 according to another embodiment of the present invention. In FIG. 2, the voltage switching section 40 further includes a transistor 46 and a transistor 56. The transistor 46 is in a cascade connection with the transistor 44. The transistor 56 is in a cascade connection with the transistor 54.

The source terminal and a substrate terminal of the transistor 44 are connected to the voltage input terminal 42. The source terminal and a substrate terminal of the transistor 46 are connected to the output terminal 48. The source terminal of the transistor 44 may function as the voltage input terminal 42. The source terminal of the transistor 46 may function as the output terminal 48.

In the present embodiment, the substrate terminal and the source terminal of the transistor 44, which is the transistor closest to the voltage input terminal 42, are connected to the voltage input terminal 42. The substrate terminal and the source terminal of the transistor 46 closest to the output terminal 48 are connected to the output terminal 48. The drain terminal of the transistor 44 is connected to the drain terminal of the transistor 46.

In the same way, the source terminal and the substrate terminal of the transistor 54, which is the transistor closest to the voltage input terminal 52, are connected to the voltage input terminal 52. The source terminal and the substrate terminal of the transistor 56 closest to the output terminal 58 are connected to the output terminal 58. The drain terminal of the transistor 54 is connected to the drain terminal of the transistor 56.

The source terminal of the transistor 46 is connected to the output terminal 48, and the gate terminal of the transistor 46 is connected to the gate terminal of the transistor 44. The first input drive voltage 132 is applied to the gate terminal of the transistor 46. In the same way, the source terminal of the transistor 56 is connected to the output terminal 58, and the gate terminal of the transistor 56 is connected to the gate terminal of the transistor 54. The second input drive voltage 134 is applied to the gate terminal of the transistor 56.

In a MOS transistor, even when the transistor is OFF, leak current flows from the source terminal towards the drain terminal. In the present embodiment, the drain terminals of two transistors are connected to each other, and so each of these transistors prevents the leak current from flowing in the other transistor. As a result, the leak current barely flows in any direction in the plurality of transistors in the cascade connection.

Furthermore, in the present embodiment, the voltage applied between the source terminal and the drain terminal in each of the transistors 44 and 46 is substantially half of the voltage applied between the voltage input terminal 42 and the output terminal 48. Accordingly, the voltage applied between the source terminal and the drain terminal in each transistor is lower than the voltage applied between the source terminal and the drain terminal in the transistor 44 shown in FIG. 1. As a result, the voltage switching section 40 of the present embodiment can use transistors having a withstand voltage between the source terminal and the drain terminal that is lower than the withstand voltage of the transistors used in FIG. 1.

Figure 3:
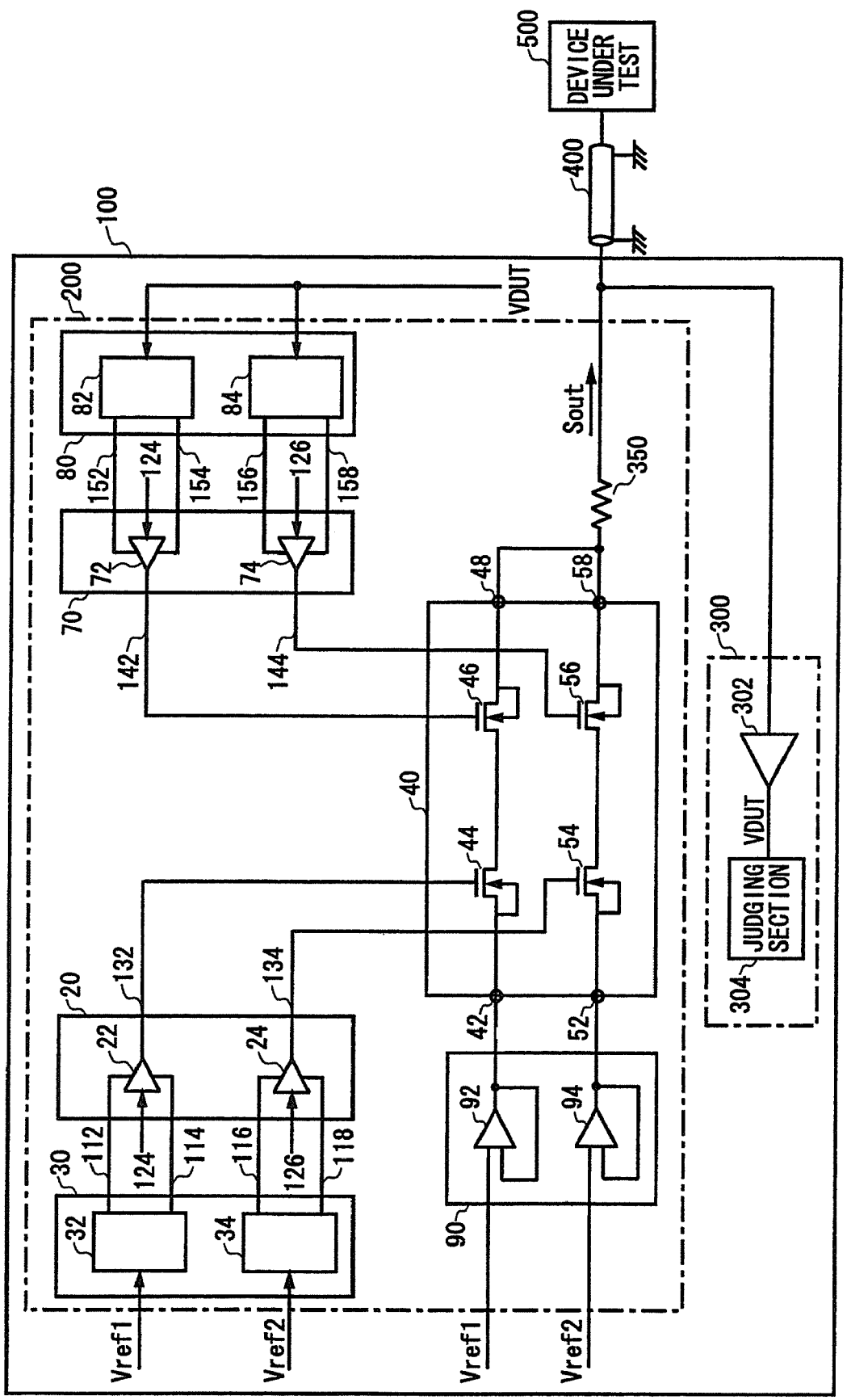
FIG. 3 shows an exemplary configuration of the test apparatus 100 according to another embodiment of the present invention.

FIG. 3 shows a configuration of the test apparatus 100 according to another embodiment of the present invention. In the present embodiment, the driver circuit 200 further includes an output gate drive section 70 and an output drive voltage supplying section 80. The output gate drive section 70 selects one of a plurality of output drive voltages supplied thereto, according to the logic value of the input pattern, and outputs the selected voltage to the gate terminal of the transistor closest to the output terminal. The output drive voltage supplying section 80 generates an output drive voltage according to the voltage of the output signal, and supplies this voltage to an output gate drive section.

The output gate drive section 70 includes a first output gate drive section 72 and a second output gate drive section 74. The output drive voltage supplying section 80 includes a first output drive voltage supplying section 82 and a second output drive voltage supplying section 84. A measured voltage VDUT is input to the input terminals of the first output drive voltage supplying section 82 and the second output drive voltage supplying section 84. The output drive voltage supplying section 80 generates the output drive voltage based on the measured voltage VDUT measured by the voltage comparator 302.

For example, the first output drive voltage supplying section 82 can apply a first high output drive voltage 152, which is higher than the measured voltage VDUT by a third prescribed voltage, to the first output gate drive section 72. The first output drive voltage supplying section 82 can also apply a first low output drive voltage 154, which is lower than the measured voltage VDUT by a fourth prescribed voltage, to the first output gate drive section 72. The third prescribed voltage and the fourth prescribed voltage may be the same.

In the same way, the second output drive voltage supplying section 84 can apply a second high output drive voltage 156, which is higher than the measured voltage VDUT by the third prescribed voltage, to the second output gate drive section 74. The second output drive voltage supplying section 84 can also apply a second low output drive voltage 158, which is lower than the measured voltage VDUT by the fourth prescribed voltage, to the second output gate drive section 74.

The third prescribed voltage may be greater than or equal to a threshold voltage at which conduction is achieved between the drain terminal and the source terminal in each of the transistors 46 and 56. The fourth prescribed voltage may be a voltage greater than or equal to 0. The third prescribed voltage and the fourth prescribed voltage may be variable voltages.

The output drive voltage supplying section 80 generates the output drive voltage based on the measured voltage VDUT, so that the output drive voltage supplying section 80 can follow a change in the voltage measured voltage VDUT and change the output drive voltage accordingly. Therefore, regardless of a change in the measured voltage VDUT, the driver circuit 200 can maintain a constant voltage between the source terminal and the gate terminal in each of the transistors 46 and 56. As a result, the withstand voltage between the source terminal and the gate terminal in each of the transistors 46 and 56 may be a voltage greater than or equal to the third prescribed voltage and the fourth prescribed voltage.

The first output gate drive section 72 selects either the first high output drive voltage 152 or the first low output drive voltage 154 according to the logic value of the first input pattern 124, and outputs the selected voltage to the first output drive voltage 142. The first output gate drive section 72 applies the first output drive voltage 142 to the gate terminal of the transistor 46. In the same way, the second output gate drive section 74 selects either the second high output drive voltage 156 or the second low output drive voltage 158 according to the logic value of the second input pattern 126, and outputs the selected voltage to the second output drive voltage 144. The second output gate drive section 74 applies the second output drive voltage 144 to the gate terminal of the transistor 56.

For example, when the first input pattern 124 has a logic value of 1, the first output gate drive section 72 selects the first high output drive voltage 152 and applies this voltage to the gate terminal of the transistor 46. When the first input pattern 124 has a logic value of 0, the first output gate drive section 72 selects the first low output drive voltage 154 and applies this voltage to the gate terminal of the transistor 46. In the same way, when the second input pattern 126 has a logic value of 1, the first output gate drive section 72 selects the second high output drive voltage 156 and applies this voltage to the gate terminal of the transistor 56. When the second input pattern 126 has a logic value of 0, the first output gate drive section 72 selects the second low output drive voltage 158 and applies this voltage to the gate terminal of the transistor 56.

The logic value of the first input pattern 124 may be the inverted logic value of the second input pattern 126. For example, when the first input pattern 124 has a logic value of 1, the second input pattern 126 has a logic value of 0. When each logic value is an inverse in this way, the transistor 44 and the transistor 46 cannot be ON at the same time as the transistor 54 and the transistor 56. Accordingly, either the first reference voltage Vref1 or the second reference voltage Vref2 is output to the device under test 500, according to the first input pattern 124 and the second input pattern 126.

The input drive voltage supplying section 30 may switch the difference between the generated input drive voltage and the reference voltage, i.e. the first prescribed voltage and the second prescribed voltage, according to the reference voltage. The output drive voltage supplying section 80 may switch the difference between the generated output drive voltage and the measured voltage VDUT, i.e. the third prescribed voltage and the fourth prescribed voltage, according to the measured voltage VDUT.

More specifically, when the ON resistances of the transistor 44 and the transistor 54 change according to the voltages of the respective source terminal or gate terminal, the input drive voltage supplying section 30 may change the first input drive voltage 132 and the second input drive voltage 134. More specifically, the input drive voltage supplying section 30 may change the first input drive voltage 132 and the second input drive voltage 134 to cancel out the change in the ON resistances of the transistors 44 and 54.

For example, if the voltage applied to the source terminal of the transistor 44 increases such that the ON resistance increases, the input drive voltage supplying section 30 may control the first input drive voltage 132 to increase when the first reference voltage Vref1 increases. Since the voltage between the source terminal and the gate terminal of the transistor 44 increases when the first input drive voltage 132 increases, the input drive voltage supplying section 30 can decrease the ON resistance in this way. As a result, the input drive voltage supplying section 30 can eliminate the voltage dependency of the ON resistance of a transistor.

In the same way, when the ON resistances of the transistor 46 and the transistor 56 change due to the measured voltage VDUT, the output drive voltage supplying section 80 may change the first input drive voltage 132 and the second input drive voltage 134 according to the measured voltage VDUT. For example, when the voltage applied to the source terminal of the transistor 46 increases such that the ON resistance increases, the output drive voltage supplying section 80 may control the first output drive voltage 142 to increase when the measured voltage VDUT increases.

Furthermore, the test apparatus 100 may store info illation indicating the relationship between the voltage applied to the source terminal, the voltage applied to the gate terminal, and the ON resistance for each transistor in the voltage switching section 40. The input drive voltage supplying section 30 may control the first input drive voltage 132 and the second input drive voltage 134 based on the information stored by the test apparatus 100. For example, when an increase in the voltage of the source terminal of the transistor 44 results in an increased ON resistance, the input drive voltage supplying section 30 may increase the first input drive voltage 132 applied to the gate terminal to decrease the ON resistance, based on the stored information. In the same way, the output drive voltage supplying section 80 may adjust the first output drive voltage 142 and the second output drive voltage 144 according to the information stored by the test apparatus 100 and the measured voltage VDUT.

As described above, in the test apparatus 100 of the present embodiment, the voltage between the source terminal and the gate terminal in each of the transistors 44 and 54 is maintained at the first prescribed voltage or the second prescribed voltage regardless of the voltage applied to the voltage input ten final 42 and the voltage input terminal 52. In the same way, the voltage between the source terminal and the gate terminal in each of the transistors 46 and 56 is maintained at the third prescribed voltage or the fourth prescribed voltage regardless of the voltage applied to the output terminal 48 and the output terminal 58. As a result, the test apparatus 100 can use transistors with low withstand voltages between the source terminals and the gate terminals, regardless of the voltage involved in testing the device under test 500.

Figure 4:
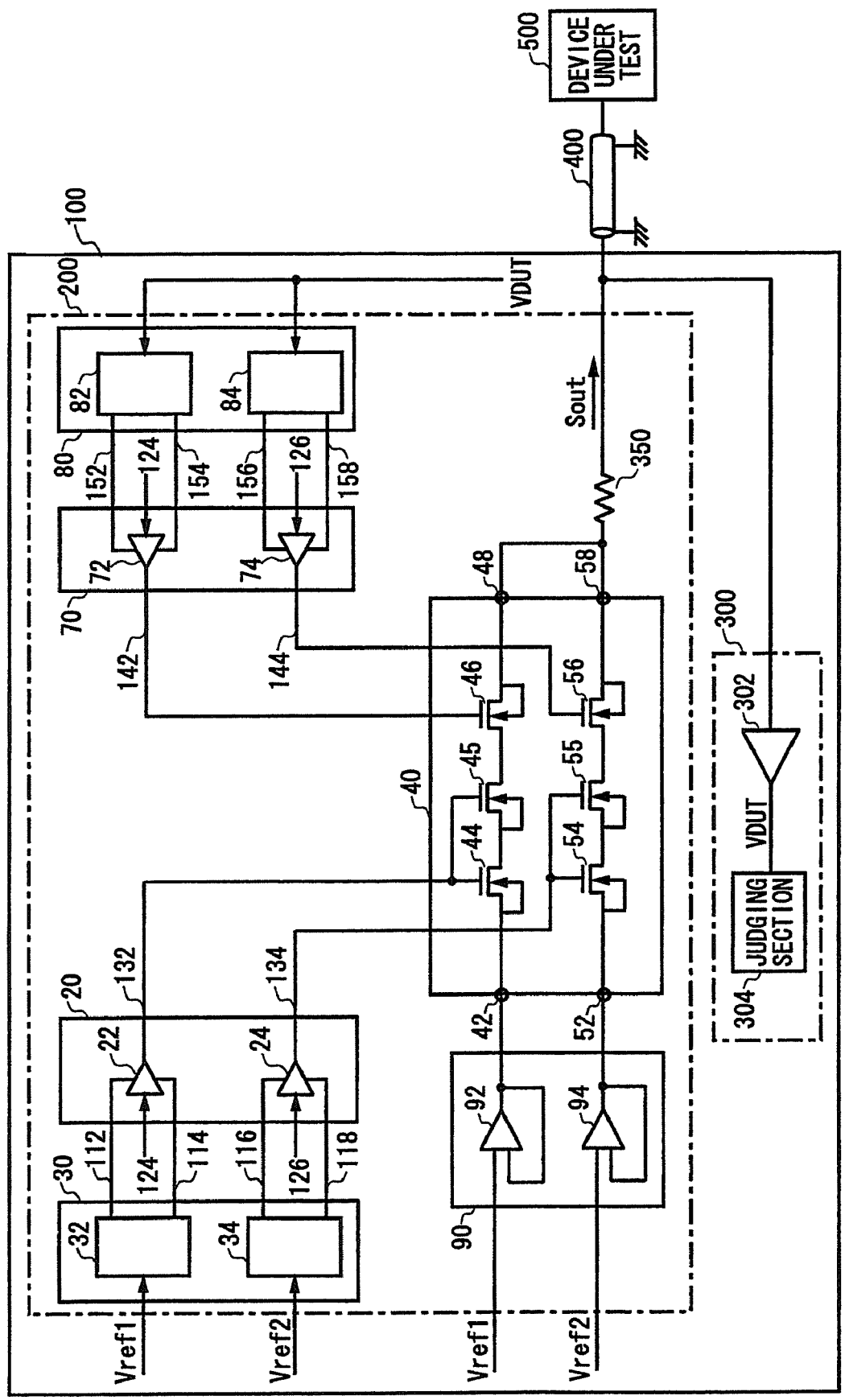
FIG. 4 shows an exemplary configuration of the test apparatus 100 according to another embodiment of the present invention.

FIG. 4 shows a configuration of the test apparatus 100 according to another embodiment of the present invention. The voltage switching section 40 of the present embodiment further includes a transistor 45 and a transistor 55. The source terminal of the transistor 45 is connected to the drain terminal of the transistor 44. The drain terminal of the transistor 45 is connected to the drain terminal of the transistor 46.

The gate terminal of the transistor 45 is connected to the gate terminal of the transistor 44, and the first input drive voltage 132 is supplied thereto. The gate terminal of the transistor 55 is connected to the gate terminal of the transistor 54, and the second input drive voltage 134 is supplied thereto.

The voltage between the source terminal and the gate terminal in each of the transistors 44, 45, and 46 is lower than the voltage applied between the source terminal and the gate terminal in each of the transistors 44 and 46 shown in FIG. 3, when the voltage between the voltage input terminal 42 and the output terminal 48 is the same. Accordingly, the voltage switching section 40 of the present embodiment can use transistors with a withstand voltage between the source terminal and the gate terminal that is even lower than the withstand voltage of the transistors used in the voltage switching section 40 shown in FIG. 3

The gate terminal of the transistor 45 is connected to the gate terminal of the transistor 46, and the first output drive voltage 142 may be applied thereto. The gate terminal of the transistor 55 is connected to the gate terminal of the transistor 56, and the second output drive voltage 144 may be applied thereto.

The source terminal of the transistor 45 may be connected to the drain terminal of the transistor 46. The gate voltage of the transistor 45 may be connected to the gate terminal of the transistor 46. In this case, the first output drive voltage 142 is applied to the gate terminal of the transistor 45.

The source terminal of the transistor 55 may be connected to the drain terminal of the transistor 56. The gate voltage of the transistor 55 may be connected to the gate terminal of the transistor 56. In this case, the second output drive voltage 144 is applied to the gate terminal of the transistor 55.

The number of transistors in the cascade connection may be increased. Any number of transistors may be in the cascade connection, as long as the total value of the ON resistance of these transistors is substantially equal to the characteristic impedance of the transmission line 400. In this case, the voltage switching section 40 may be directly connected to the transmission line 400 without being connected via the output resistor 350.

Figure 5:
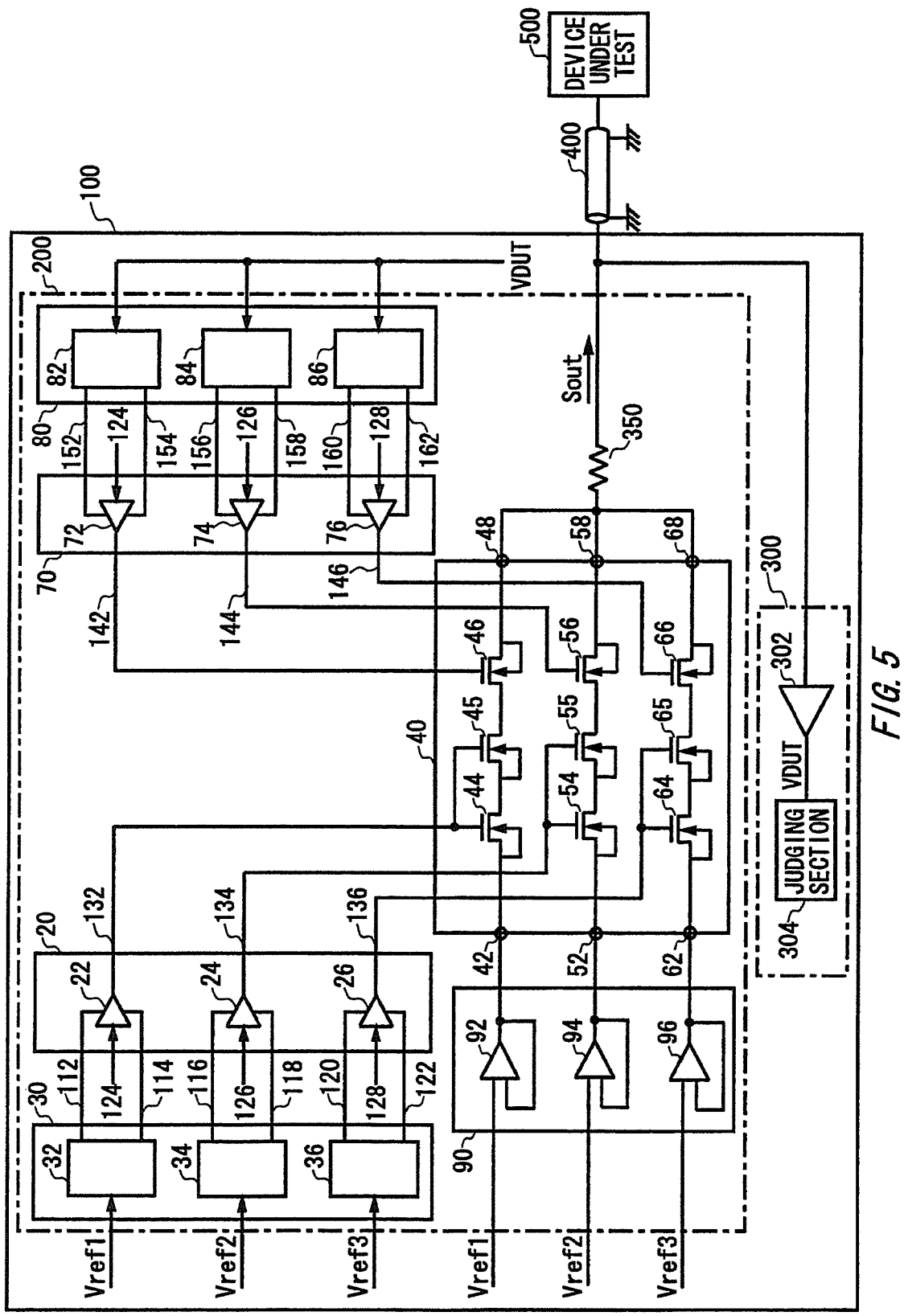
FIG. 5 shows an exemplary configuration of the test apparatus 100 according to another embodiment of the present invention.

FIG. 5 shows a configuration of the test apparatus 100 according to another embodiment of the present invention. The driver circuit 200 of the present embodiment outputs, to the device under test 500, a three-valued output signal having three different voltages. The driver circuit 200 generates the input drive voltage and the output drive voltage according to the input pattern corresponding to each value of the output signal. For example, the driver circuit 200 may be provided with a first input pattern 124 indicating a timing at which the output signal is at a first value, a second input pattern 126 indicating a timing at which the output signal is at a second value, and a third input pattern 128 indicating a timing at which the output signal is at a third value.

More specifically, the voltage switching section 40 further includes a transistor 64, a transistor 65, and a transistor 66. The source terminal of the transistor 64 is connected to the voltage input terminal 62, and the source terminal of the transistor 66 is connected to the output terminal 68. The source terminal of the transistor 65 is connected to the drain terminal of the transistor 64, and the drain terminal of the transistor 65 is connected to the drain terminal of the transistor 66.

The voltage follower circuit 90 further includes a third voltage follower 96. The third voltage follower 96 outputs, to the voltage input terminal 62, a third reference voltage Vref3 serving as the reference for the voltage value of the output signal corresponding to the third input pattern 128.

The input drive voltage supplying section 30 further includes a third input drive voltage supplying section 36. The third input drive voltage supplying section 36 generates a third high input drive voltage 120 and a third low input drive voltage 122 based on the third reference voltage Vref3.

The input gate drive section 20 further includes a third input gate drive section 26. The third input gate drive section 26 selects either the third high input drive voltage 120 or the third low input drive voltage 122, based on the third input pattern 128, and outputs the third input drive voltage 136 to the transistor 64 and the transistor 65.

The output drive voltage supplying section 80 further includes a third output drive voltage supplying section 86. The third output drive voltage supplying section 86 generates a third high output drive voltage 160 and a third low output drive voltage 162 based on the measured voltage VDUT. The output gate drive section 70 further includes a third output gate drive section 76. The third output gate drive section 76 selects either the third high output drive voltage 160 or the third low output drive voltage 162, based on the third input pattern 128, and outputs the third output drive voltage 146 to the transistor 66.

The voltage switching section 40 outputs the output signal Sout from the output terminal 68 by using the transistors 64, 65, and 66 to switch the third reference voltage Vref3 applied to the voltage input terminal 62. Since the transistors in the voltage switching section 40 are switched according to the input pattern, the output signal Sout is equal to the signal output by one of the output terminal 48, the output terminal 58, and the output terminal 68.

The voltage level of the output signal from the driver circuit 200 is not limited to having two or three possible values. The driver circuit 200 can generate an output signal with a greater number of possible values by increasing the number of elements in the input gate drive section 20, the input drive voltage supplying section 30, the voltage switching section 40, the output gate drive section 70, and the output drive voltage supplying section 80.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus and a driver circuit that switch an analog signal with low resistance and low capacitance.

What is claimed is:

1. A test apparatus that tests a device under test, comprising:
    a driver circuit that generates an output signal according to a prescribed input pattern, and supplies the output signal to the device under test; and
    a measuring section that measures a response signal output by the device under test to judge the acceptability of the device under test, wherein the driver circuit includes:
    an input gate drive section that selects one of a plurality of input drive voltages supplied thereto, according to a logic value of the input pattern, and outputs the selected input drive voltage;
    a voltage switching section that includes a transistor and that outputs the output signal according to the drain voltage of the transistor, the transistor having a gate terminal that receives the input drive voltage output by the input gate drive section and a source terminal to which is applied a prescribed reference voltage; and an input drive voltage supplying section that generates the input drive voltages according to the reference voltage, and supplies the input drive voltages to the input gate drive section.

2. The test apparatus according to claim 1, wherein the voltage switching section includes a plurality of the transistors in a cascade connection between a voltage input terminal to which the reference voltage is applied and an output terminal from which the output signal is output.

3. The test apparatus according to claim 2, wherein the plurality of transistors are NMOS transistors.

4. The test apparatus according to claim 3, wherein a source terminal and a substrate terminal of a transistor closest to the voltage input terminal, from among the plurality of transistors, are connected to the voltage input terminal, and a source terminal and a substrate terminal of a transistor closest to the output terminal, from among the plurality of transistors, are connected to the output terminal.

5. The test apparatus according to claim 4, wherein the driver circuit further includes:

an output gate drive section that selects one of a plurality of output drive voltages supplied thereto, according to the logic value of the input pattern, and outputs the selected output drive voltage to a gate terminal of the transistor closest to the output terminal; and an output drive voltage supplying section that generates the output drive voltages according to a voltage of the output signal, and supplies the output drive voltages to the output gate drive section.

6. The test apparatus according to claim 5, wherein the measuring section includes:

a voltage comparator that measures a voltage of a transmission path providing an electrical connection between an output terminal of the driver circuit and an input/output pin of the device under test; and a judging section that judges the acceptability of the device under test based on the voltage measured by the voltage comparator, and the output drive voltage supplying section generates the output drive voltages based on a value obtained by the voltage comparator by measuring the voltage output by the driver circuit.

7. The test apparatus according to claim 5, further comprising a voltage follower circuit that supplies the voltage switching section with the reference voltage.

8. A driver circuit that generates an output signal corresponding to an input pattern, comprising:

an input gate drive section that selects one of a plurality of input drive voltages supplied thereto, according to a logic value of the input pattern, and outputs the selected input drive voltage;

a voltage switching section that includes a transistor and that outputs the output signal according to the drain voltage of the transistor, the transistor having a gate terminal that receives the input drive voltage output by the input gate drive section and a source terminal to which is applied a prescribed reference voltage; and an input drive voltage supplying section that generates the input drive voltages according to the reference voltage, and supplies the input drive voltages to the input gate drive section.

9. A driver circuit that generates an output signal corresponding to an input pattern, comprising:

an output gate drive section that selects one of a plurality of output drive voltages supplied thereto, according to a logic value of the input pattern, and outputs the selected output drive voltage;

a voltage switching section that includes a transistor and that outputs the output signal according to a source voltage of the transistor, the transistor having a gate terminal that receives the output drive voltage output by the output gate drive section and a drain terminal to which is applied a prescribed reference voltage; and an output drive voltage supplying section that generates the output drive voltages according to the output signal, and supplies the output drive voltages to the output gate drive section.

\* \* \* \* \*